United States Patent [19]

Weber

[11] Patent Number: 5,034,753

[45] Date of Patent: Jul. 23, 1991

[54] ACOUSTICALLY COUPLED ANTENNA

[76] Inventor: Robert J. Weber, Box 225 - R.R. #4, Boone, Iowa 50036

[21] Appl. No.: 359,517

[22] Filed: Jun. 1, 1989

[51] Int. Cl.[5] .................... H01Q 1/480; H01Q 21/000; H03H 9/000

[52] U.S. Cl. .................................... 343/846; 333/187; 333/189; 343/853

[58] Field of Search ................ 333/186, 187, 188, 189, 333/190, 191, 192, 193, 195; 343/700 MS File, 844, 845, 829, 846, 853; 342/376

[56] References Cited

U.S. PATENT DOCUMENTS

| | | | |
|---|---|---|---|
| 2,976,501 | 3/1961 | Mattiat | 333/32 |
| 3,313,850 | 3/1943 | Usselman | 250/17 |
| 4,072,846 | 1/1978 | Oltman, Jr. | 343/700 MS |
| 4,320,365 | 3/1982 | Black et al. | 333/187 |
| 4,761,653 | 8/1988 | Owens et al. | 343/700 MS |

FOREIGN PATENT DOCUMENTS

| | | | |
|---|---|---|---|
| 0736563 | 9/1955 | United Kingdom | 333/189 |

OTHER PUBLICATIONS

Lakin et al., Thin Film Resonator Technology. 41st Ann. Frequency Control Symposium—1987, pp. 371-381.

Lakin, Equivalent Circuit Modeling of Stacked Crystal Filters, Proc. 35th Annual Frequency Control Symposium, May 1981, pp. 257-262.

Burns et al., Design and Performance of Oscillators Using Semiconductor Delay Lines, 1987 Ultrasonics Symposium, pp. 369-373.

*Primary Examiner*—Michael C. Wimer
*Assistant Examiner*—Peter Toby Brown
*Attorney, Agent, or Firm*—Leydig, Voit & Mayer

[57] ABSTRACT

An acoustically coupled antenna which can be configured as a transmitting or receiving antenna for coupling between an electrical circuit (transmitter or receiver) and an electromagnetic propagating medium such as the atmosphere. The antenna is a two port device in which one port is connected to the electrical circuit and the second port includes a transducer which interfaces (radiates or receives) electromagnetic energy with the propagating medium. The ports are acoustically coupled to each other by forming the device as a stacked crystal filter with three conductive electrodes separated by two piezoelectric resonating elements. The first port comprises two of the electrodes separated by one of the piezoelectric elements, and the second port shares the electrode separating the two piezoelectric elements, and further includes the second piezoelectric element and the final electrode. The electrical signals in the bandwidth of the antenna at the two ports are acoustically coupled by the coupled resonators of the stacked crystal filter for translating energy from one port to the other while providing electromagnetic isolation by virtue of the acoustic coupling.

16 Claims, 2 Drawing Sheets

ACOUSTICALLY COUPLED ANTENNA

FIELD OF THE INVENTION

This invention relates to the electrical antenna art, and more particularly to a miniature antenna which is relatively immune to electromagnetic interference.

BACKGROUND OF THE INVENTION

The radio antenna art is relatively well developed, and those skilled in the art appreciate many of the techniques used for configuring particular antennas for operation in particular ranges of the electromagnetic frequency spectrum and for matching the antenna configuration to the propagating medium using various well-known techniques. Means are available for matching the input of the antenna to the antenna feed or driving circuitry, and also for matching the antenna shape and configuration to the radiation resistance and the desired radiation pattern for a particular implementation. Such techniques are used with both receiving and transmitting antennas.

It is believed, however, that the techniques which have been utilized heretofore have in common the electrical coupling of signals between the electrical circuitry of the transmitter or receiver and the radiating or receiving elements (the transducer) of the antenna. More particularly, it is believed that antennas configured heretofore have been electrical devices which have electrically interfaced between the electrical receiving or driving circuitry and the electrically conductive transduction portion which interfaces with (transmits or receives electromagnetic radiation) the propagating medium. As a result, compromises are often necessary in producing the appropriate match with the electrical circuitry on one hand and the radiation resistance of the antenna on the other hand, both of which requirements must be accommodated in order to appropriately match the antenna not only to the electrical circuitry of the transmitter/ receiver, but also to the transmission or reception requirements of the overall device. In addition, it is typical to electrically tune the antenna to be responsive to signals within the desired bandwidth but to reject signals outside of the bandwidth in order to provide selectivity and also to decrease susceptibility to electromagnetic interference (EMI). EMI is considered herein to be noninformation bearing signals typically in a frequency range other than the desired passband of the antenna. While tuning can accomplish a degree of EMI rejection, since both the primary and secondary circuitry of the antenna are typically exposed to the electromagnetic interference, such interference can be coupled directly into the primary even if the secondary or the coupling means is appropriately tuned.

There also exists the need for miniaturized antennas in applications such as concealable transmitters or receivers, where the requirements are not for high power but for extreme miniaturization of the antenna elements. While printed circuit antenna or microstrip antenna configurations have been utilized for such devices, further miniaturization can be useful. In addition, microstrip or printed circuit antenna configurations are also susceptible to the electromagnetic interference coupling into the primary as discussed above.

A further difficulty with known electrical antennas is the fact that the driving point fields of the antenna occupies not only the volume outside of the radiation area where it is desired to radiate electromagnetic energy, but also the volume below the radiating element which includes the circuitry which couples the energy to the radiating element. Thus, the driving point field can be more complex than desired, and the antenna driving element itself can be a source of interference.

SUMMARY OF THE INVENTION

In view of the foregoing, it is a general aim of the present invention to provide a new antenna structure in which means other than electrical coupling is utilized for transferring energy between the antenna interface with the electrical circuit (the electrical port) and the antenna transducer which interfaces with the propagating medium (the propagating port).

In that regard, it is an object to utilize acoustic rather than electrical coupling of energy between a pair of antenna ports, one port serving as the electrical port for interface with the electrical circuitry, and the other port serving as the propagating port for interfacing with the propagating medium.

According to one aspect of the invention, it is a further object to produce an antenna which acoustically excites the antenna transducer, thereby to constrain the driving point fields to the volume outside of the radiating transducer.

In a particular aspect of the invention, it is an object to monolithically integrate an antenna with the electrical circuitry coupled to the antenna for providing an ultra-compact receiver or transmitter with integral antenna elements.

According to a particular aspect of the invention, it is an object to provide a phased array antenna system utilizing antenna elements which incorporate acoustical coupling means between the driving or receiving electrical circuitry and the actual antenna transducer which interfaces with the propagating medium.

Accordingly, in its broadest aspects, the invention provides an antenna for coupling energy in a predetermined frequency band between an electrical circuit and an electromagnetic propagating medium. The antenna has a first port for interfacing electrical energy between the electrical circuit and the antenna, and a second port having a transducer for interfacing between the propagating medium and the antenna. Acoustical coupling means are provided for acoustically coupling energy in the predetermined frequency band between the first and second ports. The acoustical coupling means includes coupled piezoelectric resonators for converting between electrical and acoustical energy in the predetermined frequency band.

Preferably, the acoustical coupling means and ports are configured as a stacked crystal filter having three electrodes sandwiching a pair of piezoelectric resonators such that one of the electrodes is shared between the two ports. In the preferred embodiment, the shared electrode is grounded, one of the ungrounded electrodes is connected for interfacing to the electrical circuit and the third electrode serves as the transducer for interfacing electromagnetic energy to the propagating medium. The grounded electrode serves as a shield for the port which is connected to the electrical circuitry and also serves as a ground plane for the transducer electrode which radiates or receives the electromagnetic energy.

In one configuration, the invention provides a phased array of such antenna elements wherein the electrical circuitry includes not only means for coupling electrical energy between the antenna and the electrical circuitry, but also means for adjusting the phase of the coupled energy to cause the array to act in a phased fashion for steering the transmitted or received beam.

Other objects and advantages will become apparent with reference to the following detailed description when taken in conjunction with the drawings, in which:

While the invention will be described in connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
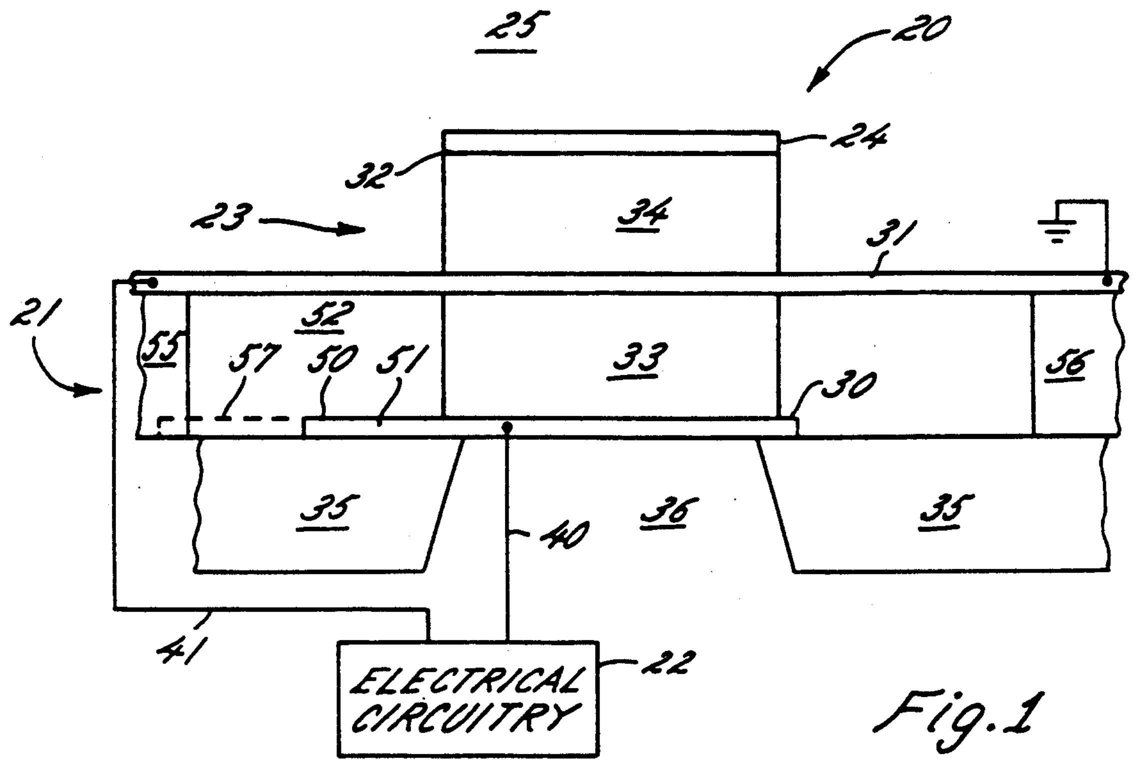
FIG. 1 is a diagram schematically illustrating a first embodiment of an antenna element exemplifying the present invention.

Turning now to the drawings, FIGS. 1 shows an antenna system including an acoustically coupled antenna generally indicated at 20 exemplifying an embodiment of the present invention. The antenna includes a first port (electrical port) generally indicated at 21 connected to electrical circuitry 22 for interfacing electrical signals between the electrical circuitry 22 and the antenna 20. The electrical circuitry 22 is illustrated as a schematic block, but is typically configured either as a driver portion of a transmitter or the front end of a receiver, or both. The antenna 20 also has a second port (propagation port) indicated generally at 23, the propagating port including a transducer 24 for interfacing with a propagating medium generally indicated at 25. The propagating medium is typically air and the transducer 24 a conductor which is driven by electrical signals when transmitting, or which receives electromagnetic radiation from the propagating medium 25 for producing electrical signals when receiving.

In practicing the invention, the ports 21, 23 are electrically isolated but acoustically coupled for coupling energy between the electrical circuitry 22 and the transducer 24 and from there to the propagating medium 25. When used as a transmitter, the electrical circuitry 22 produces electrical signals which drive the first port 21, the signals on the first port 21 being acoustically coupled to the second port 23 and then retransformed to electrical signals for driving the transducer 24 and producing electromagnetic radiation in the propagating medium 25. When the antenna is used in the receiving mode, electromagnetic radiation in the propagating medium 25 is received on the conductive transducer 24 to drive the second port 23, the energy in the second port 23 is acoustically coupled to the first port 21 and retransformed to electrical energy for driving the receiver in the electrical circuitry 22.

In accordance with the invention, the two port acoustically coupled antenna device is configured as a stacked crystal filter comprising three electrodes 30, 31, 32 sandwiching a pair of piezoelectric resonators 33, 34. As is well known, a stacked crystal filter is a thin film device in which the electrodes are of conductive metal such as aluminum deposited on a substrate generally indicated at 35 by means such as electron beam evaporation. The piezoelectric resonators 33, 34 are thin film devices of piezoelectric material such as aluminum nitride (AlN) or zinc oxide (ZnO) deposited on the associated electrodes by conventional techniques such as sputtering. Preferably, the substrate 35 is relieved at 36 as by etching to leave a section of the stacked crystal filter unsupported for free vibration in accordance with the electrical signals imposed on the driven port or ports. It will be apparent to those skilled in this art that the drawing is not to any scale and the thicknesses of the various layers are exaggerated for the purpose of clarity. For example, when the device is used as a transmitter or receiver in the GHz range, the piezoelectric films 33, 34 may be in the range of about 1 to 2 microns.

Referring in greater detail to FIG. 1, it is seen that the electrical circuitry 22 is coupled to the first port 21 by means of electrical leads 40, 41 connected to the electrodes 30, 31. The electrode 31 is preferably grounded and the signal imposed on the antenna when the circuitry 22 is a transmitter or derived from the antenna when the circuitry 22 is a receiver is carried on the line 40 with respect to ground.

It is seen that the central electrode 31 is common to both the ports 21, 23 and serves as the ground return for the electrical port 21 and a ground plane for the transmit/receiver port 23. Thus, the conductive electrode 32 which is grown atop the upper piezoelectric resonator 34 serves as the transducer for the antenna and is thus electrically conductive for interfacing electromagnetic radiation between the antenna and the propagating medium 25. When the system is used as a transmitter, electrical signals are generated in the electrode 24 which cause electromagnetic propagation into the medium 25 for reception elsewhere. When the system is used as a receiver, electromagnetic radiation in the propagating medium 25 causes current flow in the electrode 24 which is acoustically coupled by means of the stacked crystal filter to the port 21 for passage to the electrical circuitry 22.

The mechanism by which the energy transfer takes place is the acoustical coupling between the ports 21, 23 of the stacked crystal filter. More particularly, assuming that the device is used as a transmitter, the electrical circuitry 22 will generate signals and couple those signals to the electrodes 30, 31 which in turn will excite the thin film piezoelectric resonator 33. As will be noted below, the resonator is configured to resonate in the frequency band of interest, and thus, the acoustical energy produced in the piezoelectric resonator 33 by means of the signals coupled to the electrodes 30, 31 will be coupled to the upper resonator 34. The acoustic energy in the upper resonator 34 will in turn be transformed to electrical signals or current flow in the electrodes 32, 31, and the current flow in the electrode 32 (with respect to the ground plane established by the electrode 31) will radiate electromagnetic energy into the propagating medium 25.

As an important feature of the invention, the characteristics of the stacked crystal filter are configured to match the frequency band of interest for the antenna 20.

That is accomplished primarily by controlling the thicknesses of the piezoelectric resonators 33, 34 as well as the material of the resonators to assure that the total thickness of the resonator at the speed of propagation through the resonator material is one-half wavelength at the frequency of interest. The passband is typically broad enough such that the antenna will operate over a transmitting or receiving range of frequencies necessary for most applications. However, it will now be apparent that when utilizing, for example, AlN material as the piezoelectric resonators, it will be a matter of simple calculation for those skilled in the art to determine the thicknesses of the films 33, 34 to produce one-half wavelength across the resonator at the center (or other desired portion) of the passband of interest, thereby to cause resonance within the stacked crystal filter in the passband of the antenna. By virtue of the resonance, signals imposed on the first port 21 will couple strongly to the second port 23 and generate electrical signals in the electrodes 32, 31 which are of sufficient magnitude to radiate appreciable electromagnetic energy. By way of contrast, at signals which are not in the passband for which the filter is designed to resonate, destructive interference of such signals across the resonant circuit of the resonators 33, 34 will prevent reinforcement within the resonator and thus will couple little if any energy from the port 21 to the port 23. It will also be apparent that when the antenna is used as a receiver, while the coupling is in the opposite direction, the same principles apply.

As a significant feature of the invention, the shape of the electrodes is preferably configured to shield the electrical port 21 of the antenna from electromagnetic interference present in the propagating medium 25. To that end, the central ground electrode 31 is enlarged as compared to the dimensions of the resonators or other electrodes such that the non-common electrode of the electrical port 21 is shielded by the grounded common electrode. Thus, although electromagnetic interference can be present in the propagating medium 25, by virtue of the grounded shield imposed by the common electrode 31 in very close (micron) proximity to the electrode 30, the electromagnetic interference does not couple to the electrode 30. While the electromagnetic interference can couple to the exposed electrode 32, since the electromagnetic interference is typically at a frequency other than that for which the antenna is designed, and since the coupling between the ports is acoustical rather than electrical, that further path for introduction of interfering signals is also blocked. Thus, while electromagnetic signals can be imposed on the transducer 24 to excite the upper resonator 34, since the thicknesses of the resonator are such that the stacked crystal filter will not resonate at those frequencies, the acoustical path for coupling signals to the electrical port 21 is blocked. In short, the electrical port is blocked first of all by the grounded shield imposed by the common electrode and secondly by the mode of coupling of signals between ports which must resonate in order for coupling to occur.

As is well known in this art, the thin film resonators and particularly stacked crystal filters can be grown on crystalline semiconductor or semi-insulating materials such as silicon or GaAs. Thus, the substrate 35 illustrated in the drawings is intended to represent such semiconductor or semi-insulating material. In order to allow the stacked crystal filter adequate freedom of movement, as noted above, the substrate is typically etched at 36 below the filter section. Such etching can also be useful in certain embodiments where a separate connection to the lower electrode 30 is desired. In FIG. 1, the lower electrode 30 is illustrated as having a first extended portion 50 illustrated in solid lines to the left of the stacked crystal filter for providing a location such as point 51 for making connections to the lower electrode 30 when it is inconvenient to make connections in the etched region 36. It is noted that the sections 52, 53 of the device which bracket the lower resonator 33 are acoustical isolation sections and, for example, can be configured as small etched voids which allow a degree of movement of the resonator 33 for its excitation in the performance of its coupling function. Thus, when the sections 52, 53 are etched, convenient access is provided to the extended portion 50 of the electrode for making an electrical connection thereto. In a particularly useful configuration of driving circuit and stacked crystal filter on a common substrate 35, in addition to forming the central stacked crystal filter over the etched region 36, positioned exterior of the stacked crystal filter and separated by acoustic isolation regions 52, 53 are extended portions 55, 56 of the semiconductor/antenna device formed on the silicon or GaAs substrate 35. The sections 55, 56 are intended to represent active portions of a semiconductor device grown or otherwise formed on the substrate 35 and which themselves can be configured as part of the electrical circuitry 22. For example, the section 55 can represent the output of a field effect transistor such as a MOSFET formed on a silicon substrate 35 or a MESFET formed on a GaAs substrate 35, and dotted line extension 57 of the electrode 50 is intended to indicate a further connection to that output portion of the active device 55. Such a connection illustrates an important advantage of the antenna according to the present invention in that both the active device which forms the electrical circuitry 22 and the antenna elements 20 can be monolithically integrated on the same substrate 35 in order to provide an extremely miniaturized transmission or reception device complete with antenna. Such a device is intended to find significant application in miniaturized personal concealable radio devices intended for operation without detection.

Figure 2:
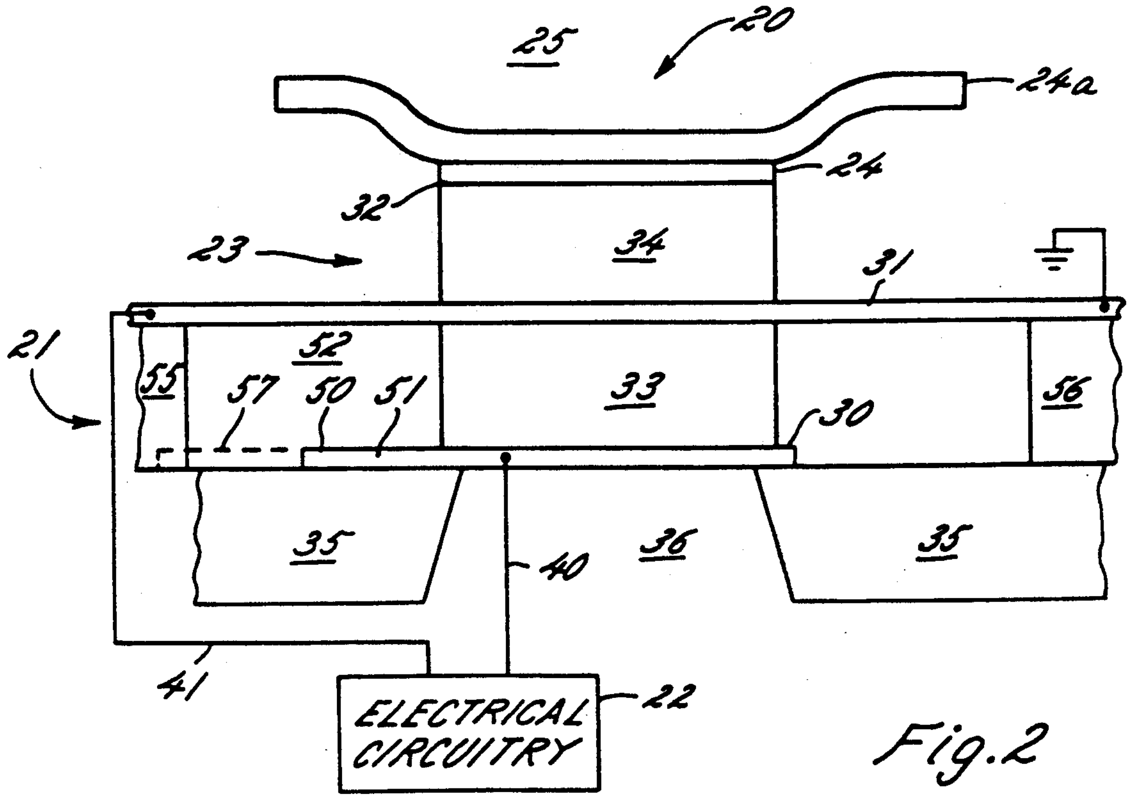
FIG. 2 is a diagram schematically illustrating a second embodiment of the present invention which includes means for enhancing the vertical aspect of the radiated field.
Figure 3:
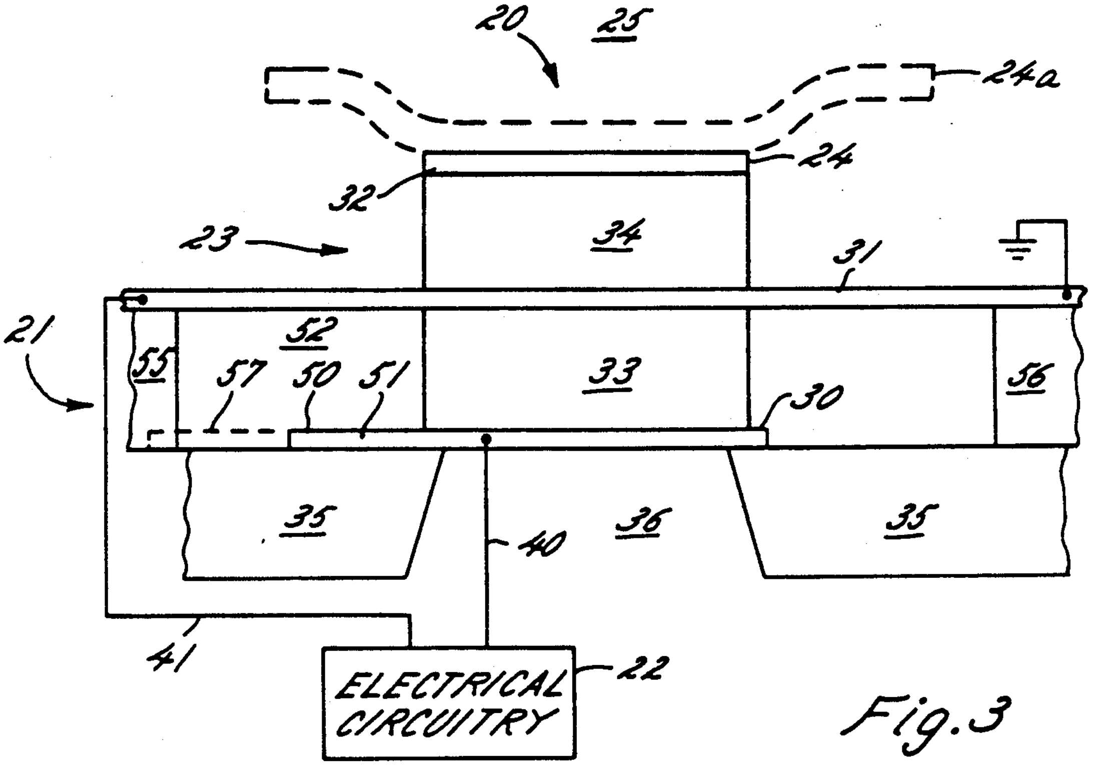
FIG. 3 is a diagram similar to FIGS. 1 and 2 illustrating features of the invention.

FIGS. 2 and 3 illustrate a further embodiment of the invention which is identical to that of FIGS. 1 and 3 with the exception of the shape of the electrode which acts as the antenna transducer for coupling to the electromagnetic propagating medium. In the FIG. 2 embodiment (and as illustrated in dashed lines in FIG. 3), the transducer generally indicated at 24 is formed in a complex non-planar shape which, in addition to the basic planar shape of the electrode 24, includes a shaped portion 24*a* which extends beyond the plane of the electrode 24 and also rises from that plane. Typically with a planar array there will be little, if any, gain at the horizon or at the zenith of the antenna. By configuring a section 24*a* as illustrated in FIG. 2, the antenna is given a vertical aspect which will cause a portion of the energy to be transmitted both to the horizon and to the zenith so that there are no zero gain areas for the antenna. Those skilled in the art of antenna design will appreciate that the shaping of the section 24*a* will cause the distribution to be altered, and configuration of the antenna in an appropriate shape to achieve the necessary distribution will be apparent to those working in this art. While the section 24*a* is shown as a further conductive section added to the electrode 32 which forms the transducer 24, it will be apparent that the elements 24 and 24a can be grown together by the same evaporation techniques used to form the other electrodes, and need not be separate elements as illustrated in FIG. 2.

Armed with the instant disclosure, the manner of configuring an antenna 20 to satisfy a particular set of transmitting or receiving conditions will now be apparent to those skilled in the antenna art. It will also be apparent to those skilled in the art that configuring an antenna 20 with separate electrical 21 and radiating 23 ports which are acoustically rather than electrically coupled achieves a certain degree of freedom in configuring the electrical port 21 to match the electrical characteristics of the coupled circuitry and the propagation port 23 for matching the radiation resistance experienced by the transducer 24. Thus, in configuring an antenna according to the invention for a particular application, the electrical impedance of the port 21 is matched to that of the driving circuitry 22 utilizing a thickness for the piezoelectric film 33 which is within the range capable of being tuned to the frequencies of interest. The electrical circuitry 22 and driving port 21 can be matched utilizing those techniques with the major constraint being the limitation on thicknesses of the resonator 33 for achieving resonance of the stacked crystal filter in the desired frequency band. The upper portion of the stacked crystal filter which serves as the radiating port, and particularly the shape of the transducer 24 is configured to match the driving point impedance of the antenna. Conventional techniques can be used such as use of a network analyzer to determine the driving point scattering matrix and to optimize the shape of the transducer electrode 24 to shape the radiation pattern in the desired fashion. The very minor thickness of the stacked crystal filter coupled with the isolation provided by the common grounded electrode restricts the radiation field of the antenna to that above the ground plane 31 and thus constrains the driving point field to the volume outside of the radiation area defined by the electrode 24.

Thus, there is a considerable degree of freedom available in designing the radiation portion of the antenna. The primary constraint imposed on the configuration of the propagation port 23 by the configuration of the electrical port 21 is that the total thicknesses of the two resonators must be resonant at the frequency of interest. That allows a substantial amount of flexibility in configuring the ports somewhat independently to optimize both with respect to their particular requirements while still achieving highly efficient acoustic coupling between the ports. It will also be apparent that a further degree of freedom is available in allowing the thicknesses of the two resonators 33, 34 to be different from each other when that is desirable, the primary requirement being that the total thickness of the two resonators be about one-half wavelength through the material of the resonators in the passband of interest.

While the shaped section 24a of the electrode 24 of FIG. 2 illustrates a particular configuration for enhancing the gain at the zenith and horizon, it more generally illustrates the principle that the size and shape of the transducer which comprises the upper electrode of the stacked crystal filter need not be constrained by the shape of the other electrodes of the stacked crystal filter. It is often desirable that the transducer electrode have about the same or greater area than the electrical electrode 30 when the device is used as a transmitter so that the transmitting port 23 can extract the maximum amount of the energy coupled into the electrical port 21 for transmission. When the device is used as a receiver, it may be preferable in many cases to make the electrode 24 or the combination electrode 24, 24a as large as possible to provide maximum excitation for the upper resonator 34 in an effort to couple adequate energy to the resonator 33 for extraction at the electrical port 21. In any event, the drawings of FIGS. 1-3 illustrate that the shapes of the electrodes for the respective ports can be independently configured within certain limitations in order to further optimize the respective ports for the functions they are intended to perform. In most events, however, it will be desirable for the common central electrode 31 to be relatively large as compared to the other electrodes for providing an adequate ground plane for the transducer electrode 24 and adequate shielding for the electrical port 21 from electromagnetic radiation.

Figure 4:
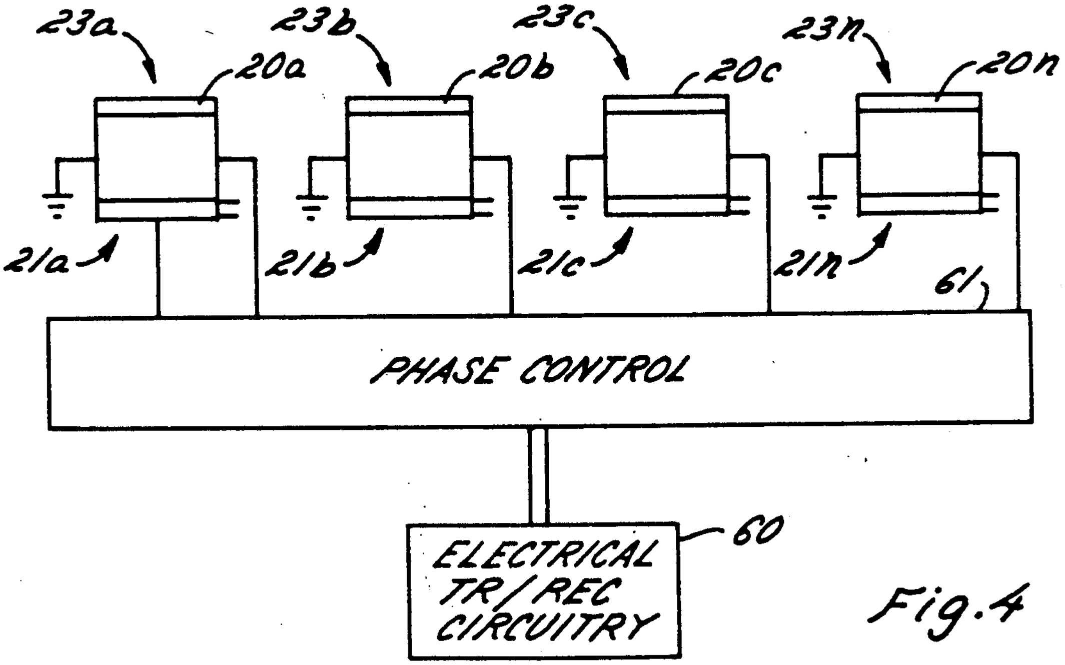
FIG. 4 is a schematic diagram illustrating a phased array of antenna elements constructed in accordance with the present invention.

Turning now to FIG. 4, there is illustrated a further embodiment of the present invention utilizing a plurality of antenna elements 20a-20n configured in an array of predetermined dimension and operated as a phased array. For example, the antennas 20a-20n are typically configured in a linear array at predetermined spacing, and are driven by electrical signals adjusted in phase to steer a beam normal to the array at any desired position in the plane normal to the array.

To that end, the normal transmit or receive circuitry is illustrated as 60 and is coupled to an intermediate phase control circuit 61 which in turn drives the electrical ports 21a-21n with the same signal but at different phases of that signal for the purposes of steering. Thus, when used as a transmitter, the signal is propagated through the transmitting ports 23a-23n with the phase delayed from radiator to radiator within the array, and with the phase being adjusted from pulse to pulse of transmitted energy to cause the steering of the beam from the phased array. Similarly, when the array is used in a receiving mode, signals received at the individual antenna elements are coupled to the electrical circuitry in phase differentiation as controlled by signals from the phase control circuit 61 such that the received signal is selected from any point in the plane perpendicular to the array as determined by the relative phasing between the received signals. The phased array itself will not be explained further herein since such techniques for steered beam radar and the like are well known to those skilled in the art. What will be now apparent to those skilled in the art, however, is that such a phased array can be achieved with significant isolation between the phase control electrical elements of the control electronics and the transmitting or receiving transducer elements of the antenna, with the coupling between such elements being accomplished acoustically to achieve the independent degrees of freedom in configuring the respective ports and the isolation between the ports described in detail above.

It will now be apparent that what has been provided is a new configuration of antenna which has a first port for coupling to electrical circuitry which is typically a transmitter or a receiver and a second port for interfacing with a propagating medium. Each port has electrodes for coupling to the respective elements, with one of the electrodes of the port coupled to the propagating medium serving as the transmitting or receiving transducer. The ports are electrically isolated but acoustically coupled so that the energy which is passed between the electrical elements coupled to one port and the electromagnetic radiating elements coupled to the other port are interfaced only by way of the acoustical coupling. Acoustical coupling is accomplished by means of a stacked crystal filter which is tuned to the passband at which the antenna is intended to operate, so as to couple energy at maximum efficiency between the ports in the passband of the antenna but to sharply reject energy out of the band. Susceptibility to electromagnetic interference, which is provided in one measure by virtue of the acoustic rather than electrical coupling, is further enhanced by configuring a common electrode between the elements of the stacked crystal filter as an extended ground plane which constrains the driving point field of the transducer section of the antenna to the volume outside the radiating area.

What is claimed is:

1. An antenna for coupling energy in a predetermined frequency band between an electrical circuit and an electromagnetic propagating medium, the antenna comprising, in combination:

a first port coupled to and electrically matched to the electrical circuitry for exchanging energy therewith, a second port having a transducer for interfacing between the antenna and the propagating medium, the transducer having no leads connected thereto and serving to convert between electrical signals in the transducer and electromagnetic radiation in the propagating medium, and means for acoustically coupling the first and second ports, the acoustical coupling means serving to translate between electrical energy in the predetermined frequency band at the ports and acoustical energy for coupling between the ports, the acoustical coupling means including coupled piezoelectric resonators for providing the acoustical coupling, the first port including first electrode means formed on the piezoelectric resonators and connected to the electrical circuitry for transforming between electrical energy in the electrical circuitry and acoustical energy in the piezoelectric resonators, the second port including second electrode means formed on the piezoelectric resonators, said second electrode means serving as the transducer for coupling energy between the propagating medium and the piezoelectric resonators.

2. The combination as set forth in claim 1, wherein the first port comprises a pair of electrodes separated by a first piezoelectric resonator, the second port comprises a pair of electrodes separated by a second piezoelectric resonator, one of the electrodes of the first and second ports being a common electrode disposed in both said ports, whereby the piezoelectric resonators separated by the common electrode serve as the coupling means between the ports, the non-common electrode of the second port serving as said transducer for coupling energy between the piezoelectric resonators and the propagating medium.

3. The combination as set forth in claim 1 wherein the ports and coupling means are configured as a stacked crystal filter comprising three thin film electrodes disposed on and separated by first and second thin film piezoelectric resonating elements, a central one of the three electrodes being shared by the two ports, the piezoelectric resonators being acoustically coupled for acoustically coupling energy between the ports and translating the coupled energy to or from electrical energy at the ports.

4. The combination as set forth in claim 3 wherein the electrical circuit and stacked crystal filter are supported on a common semiconductor or semi-insulator substrate.

5. A phased antenna array comprising a plurality of antenna elements as set forth in claim 3 and wherein the electrical circuit includes phase control means for phasing the elements in the antenna array.

6. An antenna for coupling energy in a predetermined frequency band between an electrical circuit and an electromagnetic propagating medium capable of propagating electromagnetic energy in said predetermined frequency band, the antenna comprising the combination of:

a first port for interfacing electrical energy between the electrical circuit and the antenna in the predetermined frequency band, a second port having a transducer for interfacing between the propagating medium and the antenna in the predetermined frequency band, the transducer having no leads connected thereto and serving to convert between electrical signals in the transducer and electromagnetic radiation in the propagating medium, and acoustical coupling means for acoustically coupling energy in the predetermined frequency band between the first and second ports, the acoustical coupling means including coupled piezoelectric resonators for converting between electrical and acoustical energy in the predetermined frequency band, the first port including first electrode means formed on the coupled piezoelectric resonators and connected to the electrical circuit for transforming between electrical energy in the electrical circuit and acoustical energy in the piezoelectric resonators, the second port including second electrode means formed on the coupled piezoelectric resonators for transforming between electrical energy in the second electrode means and acoustical energy in the coupled piezoelectric resonators, the second electrode means being disposed for coupling electromagnetic energy with the propagating medium, thereby to serve as the transducer of the second port for coupling with the propagating medium.

7. The combination as set forth in claim 6 in which the first and second ports and the coupling means comprise a thin film stacked crystal filter, the stacked crystal filter having first and second thin film piezoelectric resonators separated by a thin film common electrode and sandwiched by first and second thin film electrodes associated respectively with the first and second piezoelectric resonators, the stacked crystal filter comprising said coupled piezoelectric resonators of the coupling means, the first and common electrodes associated with the first piezoelectric resonator including connecting means for coupling to the electrical circuit for interfacing electrical energy in the predetermined frequency band therewith, the second electrode associated with the second piezoelectric resonator comprising said transducer for coupling energy between the second port and the propagating medium in the predetermined frequency band.

8. The combination as set forth in claim 7 in which the common electrode is grounded and serves as a shield against electromagnetic interference protecting said first port from electromagnetic radiation outside of the predetermined frequency band.

9. The combination as set forth in claim 8 wherein the grounded common electrode serves as a ground plane for said transducer.

10. The combination as set forth in claim 7 in which the antenna is a transmitting antenna, the electrical circuit being a transmitter driver for connection to the first port for exciting the first piezoelectric resonator therein, the transducer being a radiator of electromagnetic energy in the predetermined frequency band, the coupling means serving to couple acoustic energy from the first piezoelectric resonator to the second piezoelectric resonator and translate said coupled acoustical energy into electrical energy in the second port for radiation by the transducer.

11. The combination as set forth in claim 7 in which the antenna is a receiving antenna, the electrical circuit being an electrical receiver for receiving electrical signals from the first port, the transducer in the second port being adapted to receive electromagnetic energy from the propagating medium and excite the second piezoelectric resonator, the coupling means serving to couple acoustical energy from the second to the first piezoelectric resonator for translation into electrical signals by the first piezoelectric resonator and coupling to said electrical receiver.

12. The combination as set forth in claim 7 wherein the electrical circuit and stacked crystal filter are supported on a common semiconductor or semi-insulator substrate.

13. A phased antenna array comprising a plurality of antenna elements as set forth in claim 7 and wherein the electrical circuit includes phase control means for phasing the elements in the antenna array.

14. An antenna for coupling energy in a predetermined frequency band between an electrical circuit and a propagating medium, the antenna comprising in combination:

a stacked crystal filter having first, second and third thin film electrodes, the stacked crystal filter also having first and second thin film piezoelectric elements interposed respectively between the first and second and the second and third electrodes, the first and second electrodes and first piezoelectric element therebetween serving as a first port for coupling to the electrical circuit and transforming between electrical energy in the electrical circuit and acoustical energy in the piezoelectric elements, the second and third electrodes and second piezoelectric element therebetween serving as a second port for coupling to the propagating medium and transforming between acoustical energy in the piezoelectric elements and electromagnetic energy in the propagating medium, the third electrode having no lead wires connected thereto and being disposed in the propagating medium for translating between electromagnetic radiation in the medium and conductive currents in the electrode, the piezoelectric elements being resonant in the predetermined frequency band of the antenna for acoustically coupling the first and second ports in the predetermined frequency band for selectively passing energy therebetween in said frequency band.

15. The combination as set forth in claim 14 wherein the electrical circuit and stacked crystal filter are supported on a common semiconductor or semi-insulator substrate.

16. A phased antenna array comprising a plurality of antenna elements as set forth in claim 14 and wherein the electrical circuit includes phase control means for phasing the elements in the antenna array.

* * * * *